April 2, 1963 R. E. LEO 3,084,286
BINARY COUNTER
Filed July 20, 1960

INVENTOR.
ROBERT E. LEO
BY
[signature]
ATTORNEY.

United States Patent Office 3,084,286
Patented Apr. 2, 1963

3,084,286
BINARY COUNTER
Robert E. Leo, Sunnyslope, Ariz., assignor to General Electric Company, a corporation of New York
Filed July 20, 1960, Ser. No. 44,080
2 Claims. (Cl. 328—42)

Figure 1:
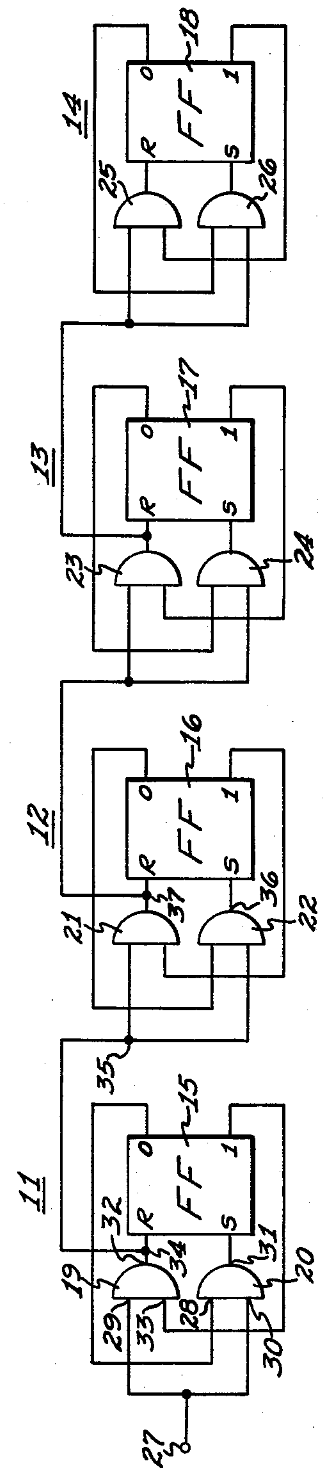

This invention relates to binary counters. More particularly, it relates to binary counters wherein a plurality of flip-flops are cascaded to form a multistage binary counter.

A flip-flop may be defined as a device having two stable states which may be referred to as a "0" state and a "1" state. A flip-flop includes a pair of output terminals which may be referred to as the 0-output terminal and the 1-output terminal. When the flip-flop is in its "0" state, an output signal or specified voltage level is present at its 0-output terminal, and when a flip-flop is in its "1" state, the output signal or specified voltage level appears at its 1-output terminal. A flip-flop further includes a pair of input terminals which may be referred to as the reset terminal and the set terminal. In a flip-flop, when an input signal, such as a voltage pulse, is applied to the reset terminal of the flip-flop, the flip-flop is said to be "reset" and is forced to assume its "0" state. When an input signal is applied to the set terminal of a flip-flop, the flip-flop is said to be "set" and is forced to assume its "1" state. Electronic devices which may act as flip-flops are well known in the art.

A binary counter is a device for counting according to the binary system. A flip-flop may be used as a binary counter for counting, say, a series of input signals such as pulses, by arranging for the flip-flop to be alternately set and reset as each input signal or pulse in the series appears. Such a binary counter has only two different states. A plurality of $n$ flip-flops may be cascaded, i.e. linked together, to form a binary counter having $2^n$ different states by arranging, for example, for an input signal to be applied to a succeeding flip-flop only when the preceding flip-flop is being reset. Such binary counters are well kown in the art. In such a binary counter, the combination of a flip-flop and the associated circuitry for arranging that the flip-flop be alternately set and reset may be termed a "stage" of the binary counter.

In the prior design of binary counters, an AND-gate has been used to link a stage of the counter with the preceding stage to perform the function of applying a signal to the stage only when the flip-flop in the preceding stage is being reset. An AND-gate may be defined as a device having an output terminal and a plurality of input terminals and which provides an output signal at its output terminal only when input signals are simultaneously applied to all of its input terminals. For examples of such prior design, reference is made to R. K. Richards, "Digital Computer Components and Circuits" (D. Van Nostrand Co., Inc., 1957), page 177, and R. K. Richards, "Arithmetic Operations in Digital Computers" (D. Van Nostrand Company, Inc., 1955), page 195. By means of the present invention, such linking AND-gates as are shown in the art may be eliminated with no decrease in performance.

It is, thus, a principal object of the present invention to provide a binary counter which is simplified in construction with no decrease in performance.

Another object of this invention is to provide a circuit for a binary counter wherein a saving in the number of necessary components may be realized with no corresponding decrease in performance.

Yet another object of the present invention is to provide improved reliability in a binary counter by decreasing the number of necessary components in the circuit of the binary counter.

Additional objects and features will be apparent from the description which follows.

Briefly stated, according to one embodiment, the present invention comprises a binary counter having a plurality of stages, each stage including a flip-flop and a pair of AND-gates for providing alternate setting and resetting of the flip-flop as successive signals are applied to the stage. The stages are connected by a wire or lead from the output terminal of an AND-gate in one stage to input terminals in the AND-gates of the next stage.

Figure 2:
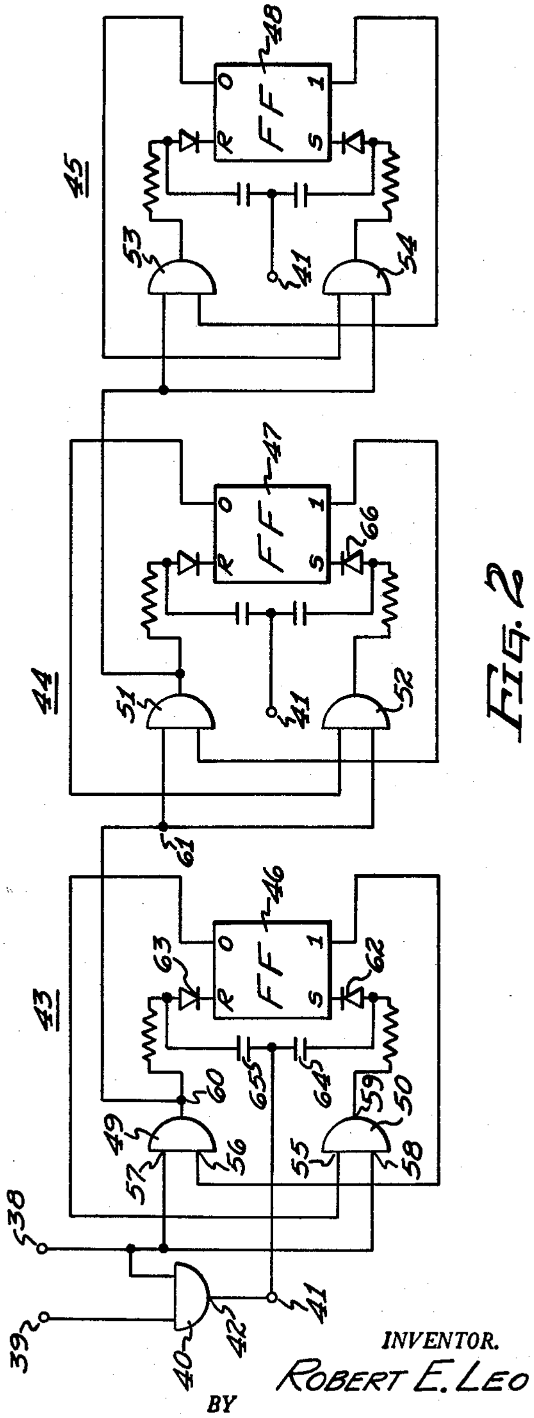

While the specification concludes with claims particularly pointing and distinctly claiming the subject matter of the present invention, it is believed that the invention will be better understood from the following description taken in connection with the accompanying drawings in which:

FIGURE 1 is a block diagram of the preferred embodiment of the binary counter circuit of the present invention, and FIGURE 2 is a block diagram of the binary counter circuit of the present invention illustrating the employment of clock pulse timing means to synchronize the response of the flip-flop in each stage of the binary counter.

FIGURE 1 illustrates a binary counter constructed according to the present invention and having four stages 11, 12, 13, 14. Each stage 11, 12, 13, 14 includes a respective flip-flop 15, 16, 17, 18 and a respective pair of AND-gates 19 and 20, 21 and 22, 23 and 24, 25 and 26. Each flip-flop 15–18 has a reset terminal R, a set terminal S, a 0-output terminal, and a 1-output terminal. Counter input terminal 27 is adapted to receive the input signals which are to be counted.

Assume that flip-flops 15–18 are initially all in their "0" states. Thus, a signal will be applied through the lead shown from the 0-output terminal of flip-flop 15 to input terminal 28 of AND-gate 20. Assume now that an input signal is applied to counter input terminal 27. This input signal will be applied through the leads shown from counter input terminal 27 to both input terminal 29 of AND-gate 19 and input terminal 30 of AND-gate 20. Since signals are being applied simultaneously to both input terminals 28, 30 of AND-gate 20, an output signal will be applied from output terminal 31 of AND-gate 20 to the set terminal of flip-flop 15, setting flip-flop 15. Thus, flip flop 15 is transferred to its "1" state. There will be no output signal from output terminal 32 of AND-gate 19 due to the absence of a signal appearing at its input terminal 33 which is connected to the 1-output terminal of flip-flop 15.

An AND-gate will herein be termed "enabled" when a signal is being applied to one input terminal of the AND-gate from either the 0-output terminal of a flip-flop or the 1-output terminal of a flip-flop. An AND-gate will be otherwise termed "disabled."

Since AND-gate 19 is disabled at the time of the first counter input signal, there will at that time be no signal applied from output terminal 32 of AND-gate 19 to output terminal 34 of stage 11, and stages 12, 13, and 14 will be unaffected by the first counter input signal.

Assume now that a second input signal is applied at counter input terminal 27. Since flip-flop 15 was transferred to its "1" state when the first counter input signal was applied, AND-gate 19 is now enabled and AND-gate 20 is disabled. Thus, AND-gate 19 will deliver a signal from its output terminal 32. This signal will both reset flip-flop 15 and be applied to output terminal 34 of stage 11. Output terminal 34 of stage 11 is connected by a lead to input terminal 35 of stage 12 and a signal will thus be applied to input terminal 35. Since flip-flop 16 of stage 12 is in its "0" state, and since AND-gates 21 and 22 are connected to flip-flop 16 in the same manner shown for the connections of stage 11, AND-gate 22 is enabled and AND-gate 21 is disabled. At the time of the input signal to input terminal 35 of stage 12, AND-gate 22 will thus provide a signal at its output terminal 36, setting flip-flop 16. Since AND-gate 21 is disabled, there will be no signal at output terminal 37 of stage 12 and stages 13 and 14 will remain unaffected by the second count input signal and their respective flip-flops 17 and 18 will remain in their "0" states. Thus, after the second count input signal, flip-flop 15 will be in its "0" state, flip-flop 16 in its "1" state, flip-flop 17 in its "0" state, and flip-flop 18 in its "0" state.

The manner in which the binary counter of FIGURE 1 functions and the manner in which succeeding counter input signals will affect the binary counter is believed made clear by the above description. Table 1 illustrates the states of the flip-flops 15–18 after receipt of the indicated number of input signals at counter input terminal 27.

*Table 1.—States of Flip-Flops 15–18 Corresponding to Number of Input Signals Received by Binary Counter of Figure 1*

| Number of Input Signals Received | Flip-Flop States | | | |
|---|---|---|---|---|
| | 15 | 16 | 17 | 18 |
| 0 | 0 | 0 | 0 | 0 |
| 1 | 1 | 0 | 0 | 0 |
| 2 | 0 | 1 | 0 | 0 |
| 3 | 1 | 1 | 0 | 0 |
| 4 | 0 | 0 | 1 | 0 |
| 5 | 1 | 0 | 1 | 0 |
| 6 | 0 | 1 | 1 | 0 |
| 7 | 1 | 1 | 1 | 0 |
| 8 | 0 | 0 | 0 | 1 |
| 9 | 1 | 0 | 0 | 1 |
| 10 | 0 | 1 | 0 | 1 |
| 11 | 1 | 1 | 0 | 1 |
| 12 | 0 | 0 | 1 | 1 |
| 13 | 1 | 0 | 1 | 1 |
| 14 | 0 | 1 | 1 | 1 |
| 15 | 1 | 1 | 1 | 1 |
| 16 (Resets the counter to zero.) | 0 | 0 | 0 | 0 |

As shown by the above description and by Table 1, the binary counter of FIGURE 1 has 16 possible states which are progressively assumed as input signals appear at counter input terminal 27. Thus, the binary counter of FIGURE 1 has the ability to count to 16. When the principles of the present invention are employed, any number of stages may be linked together to provide for an ability to count to any number desired. Each stage of the counter will be alike, and may include only a flip-flop and two AND-gates. It is a principal feature of the present invention that the connections between the various stages of the binary counter require no circuit components, but only require a lead from the output terminal of an AND-gate in a preceding stage to an input terminal of an AND-gate in a succeeding stage. Prior art binary counters of the type of the present invention contain circuit components in the connections between the various stages.

The nature of the signals applied at the various terminals of the present invention, except as hereinafter mentioned, are open to choice provided the state of "signal" can be clearly differentiated from the state of "no signal." For example, the existence of a first fixed level of potential may be considered a signal and the existence of a second fixed level of potential may be considered lack of a signal. The signal (or lack of signal) from an output terminal of a flip-flop will ordinarily be steady between transfers of state of the flip-flops whereas counter input signals will ordinarily be of the short-duration or pulse variety.

In the binary counter of FIGURE 1, it is preferred that the counter input signals consist of pulses which are of longer duration than the time required to initiate the setting or resetting of the flip-flops used in the counter, but which are of shorter duration than the time required for the flip-flops to transfer to a new steady state after their setting or resetting has been initiated.

FIGURE 2 illustrates a synchronized binary counter employing the principles of the present invention. The two input terminals to the counter, counter input terminal 38 and clock pulse input terminal 39, are connected respectively to the two input terminals of AND-gate 40. Terminal 41 is connected to the output terminal 42 of AND-gate 40. The binary counter of FIGURE 2 consists of three stages 43, 44, 45, each stage including a respective flip-flop 46, 47, 48, a respective pair of AND-gates 49 and 50, 51 and 52, 53 and 54, and capacitor-resistor-diode circuitry as shown.

Assume that a potential representing a signal is applied at counter input terminal 38. Assume also that flip-flops 46, 47, 48 are initially all in their "0" states. Since the 0-output terminal of flip-flop 46 is connected to input terminal 55 of AND-gate 50, AND-gate 50 is enabled. The 1-output terminal of flip-flop 46 is connected to input terminal 56 of AND-gate 49. AND-gate 49 is disabled since flop-flop 46 is in its "0" state. The signal applied to counter input terminal 38 is transmitted to both input terminal 57 of AND-gate 49 and input terminal 58 of AND-gate 50. Since only AND-gate 50 is enabled, a signal will be applied to output terminal 59 of AND-gate 50 but not to output terminal 60 of AND-gate 49. Since output terminal 60 is connected to input terminal 61 of stage 44, stages 44 and 45 will not be affected at the time of the application of the first signal at counter input terminal 38.

The potential of the signal applied to output terminal 59 of AND-gate 50 is applied to the anode of diode 62. Diode 62 and the level of potential applied as a signal from AND-gate 50 are chosen so that diode 62 is not forward biased by the application of a signal from AND-gate 50; however, they are chosen so that an application of a signal from AND-gate 50 will bring diode 62 sufficiently close to being forward biased to enable an added potential difference of the magnitude of a signal pulse from AND-gate 40 to forward bias diode 62. The cathode of diode 62 is connected to the set terminal of flip-flop 46. As shown, diode 63 has the same relationship with AND-gate 49 and the reset terminal of flip-flop 46 as diode 62 has with AND-gate 50 and the set terminal of flip-flop 46. It is seen that diodes 62 and 63 normally prevent flip-flop 46 from being affected even when a signal is being applied to counter input terminal 38.

Assume now that while a signal is being applied to counter input terminal 38, an input signal of clock pulse duration is applied to clock pulse input terminal 39. Since signals are being simultaneously received at both its input terminals, AND-gate 40 will apply a signal of clock pulse duration to its output terminal 42. This signal will be applied to terminal 41 which is connected to output terminal 42. The potential levels of outputs of AND-gate 40 are chosen so that the potential difference between the output of "signal" level from AND-gate 40 and the output of "no signal" level from AND-gate 40 is large enough to forward bias diodes 62 and 63 when their anodes are receiving signals from their respective associated AND-gates 50 and 49 but small enough so that diodes 62 and 63 will not be forward biased when no signals are being applied to their anodes by their respective associated AND-gates 50 and 49.

As shown, the signal pulse of clock pulse duration applied at terminal 41 is applied through capacitor 64 to the anode of diode 62, whereby diode 62 is forward biased and a signal is applied to the set terminal of flip-flop 46, setting flip-flop 46. The signal pulse applied at terminal 41 is also applied to the anode of diode 63 through capacitor 65 but is insufficient to forward bias diode 63 since no biasing signal is being received from AND-gate 49.

It is seen that, in the circuit of FIGURE 2, diodes 62, 63, and the other diodes shown each function somewhat like an AND-gate in that each diode has two input terminals and an output terminal and, as used in the circuit, a signal is applied to the output terminal of the diode only when signals are simultaneously applied to both input terminals. In this case, the first input signal, say to diode 62 from AND-gate 50, serves to lower the threshold of the diode, i.e. bias the diode so that less increase in potential at its anode will now forward bias it. And the second input signal, say from terminal 41 to diode 62, is a positive pulse which temporarily makes the anode of the diode sufficiently positive to forward bias the diode and transmit a signal in the form of a positive pulse to the output terminal of the diode. A gate which operates in the above manner will be herein termed a threshold gate.

At the next time at which signals are present at counter input terminal 38 and clock pulse input terminal 39 simultaneously, flip-flop 46, will be in its "1" state. AND-gate 49 will be enabled and flip-flop 46 will be reset. A signal will be applied to input terminal 61 of stage 44 from output terminal 60 of AND-gate 49. Since flip-flop 47 is in its "0" state, and AND-gate 52 will be enabled and its output signal will bias diode 66 sufficiently so that the signal from terminal 41 will forward bias diode 66, and flip-flop 47 will be set. AND-gate 51 is disabled and stage 45 is still unaffected, even after the second time at which signals from terminals 38, 39 coincide.

It is seen that the binary counter of FIGURE 2 has substantially the same counting operation as the binary counter of FIGURE 1 and that the binary counter of FIGURE 2 counts the number of times at which a clock pulse input signal appears at clock pulse input terminal 39 while there is a signal appearing at counter input terminal 38. A signal applied at counter input terminal 38 will result in certain diodes of the binary counter of FIGURE 2 being biased in the manner above discussed. Then, upon the application of an input signal at clock pulse input terminal 39, the states of certain of the flip-flops 46, 47, 48 will change at the same time to provide a new count. Thus, it may be said that the counting operation of the binary counter of FIGURE 2 is in synchronization with the clock pulse input signals.

Assume that the signal applied to counter input terminal 38 is of long duration, spanning multiple clock pulses. Thus, provided the flip-flops 46, 47, 48 settle in their new states in a time interval less than that between clock pulses, the binary counter of FIGURE 2 will progressively change count with each application of a clock pulse input signal at clock pulse input terminal 39. It is preferred in the binary counter of FIGURE 2 that the counter input signal be of this type. That is, it is preferred that counting proceed at the clock pulse input signal rate while a signal is applied to counter input terminal 38 and that the counter input signal be cut off only at those times when counting is not desired.

The purpose of AND-gate 40 is to isolate the binary counter of FIGURE 2 from clock pulse input signals except during times when operation of the counter is desired, i.e. except when a signal is being applied to counter input terminal 38. The use of AND-gate 40 is a precaution to eliminate, so far as possible, unnecessary application of signals to the stages 43, 44, 45. If this precaution is not desired in a particular application, AND-gate 40 may be eliminated and terminal 41 used directly as the clock pulse input terminal. The nature of the signals applied to terminal 41 in this case should, of course, be the same as would ordinarily be applied to terminal 41 by AND-gate 40 so that the operation of the threshold gates would remain essentially unaltered.

Thus, novel circuits for binary counters have been described in which only wires or leads are required to interconnect the stages of the counters.

While the principles of the invention have now been made clear in illustrative embodiments, there will be immediately obvious to those skilled in the art many modifications in structure, arrangement, proportions, the elements, materials and components used in the practice of the invention, and otherwise, which are particularly adapted for specific environments and operating requirements, without departing from those principles. The appended claims are, therefore, meant to cover and embrace any such modifications, within the limits only of the true spirit and scope of the invention.

What is claimed is:

1. A binary counter comprising: a pair of flip-flops, each flip-flop having a set terminal, a reset terminal, a 1-output terminal, and a 0-output terminal; a pair of AND-gates associated with each of said flip-flops, each AND-gate having a pair of input terminals and an output terminal; means for connecting the 1-output terminal of each of said flip-flops to one input terminal of one of the associated pair of said AND-gates; means for connecting the 0-output terminal of each of said flip-flops to one input terminal of the other of the associated pair of said AND-gates; means for connecting the output terminal of each said one AND-gate to the reset terminal of the associated one of said flip-flops; means for connecting the output terminal of each said other AND-gate to the set terminal of the associated one of said flip-flops; means for connecting the output terminal of said one AND-gate associated with a first of said flip-flops to the other input terminal of each of the pair of AND-gates associated with a second of said flip-flops; a counter input terminal adapted to have a series of input signals applied thereto; and means for connecting said counter input terminal to the other input terminal of each of said pair of AND-gates associated with the first of said flip-flops.

2. A synchronized binary counter comprising: a pair of flip-flops, each of said flip-flops having a set terminal, a reset terminal, a 1-output terminal, and a 0-output terminal; a first pair of AND-gates associated with a first of said flip-flops and a second pair of AND-gates associated with a second of said flip-flops, each AND-gate of said pairs of AND-gates having a pair of input terminals and an output terminal; a first pair of threshold gates associated with the first of said flip-flops and a second pair of threshold gates associated with the second of said flip-flops, each threshold gate of said pairs of threshold gates having a first input terminal, a second input terminal, and an output terminal and being adapted for producing a signal at its output terminal only when signals are applied to both its input terminals; means for connecting the 1-output terminal of each of said flip-flops to one input terminal of one AND-gate of the pair of AND-gates associated with each respective flip-flop; means for connecting the 0-output terminal of each of said flip-flops to one input terminal of the other AND-gate of the pair of AND-gates associated with each respective flip-flop; means for connecting the output terminal of each AND-gate of said two pairs of AND-gates to one corresponding input terminal of each threshold gate of said two pairs of threshold gates; a first counter input terminal adapted to have a series of clock pulse input signals applied thereto; means for connecting said first counter input terminal to the other input terminal of each threshold gate of said two pairs of threshold gates; means for connecting the output terminal of a first of each said pair of threshold gates to the reset terminal of its associated flip-flop; means for connecting the output terminal of a second of each said pair of threshold gates to the set terminal of its associated flip-flop; means for connecting the output terminal of said one AND-gate of said first pair of AND-gates to the other input terminal of each of said second pair of AND-gates; a second counter input terminal adapted to have input signals applied thereto; and means for connecting said second counter input terminal to the other input terminal of each of said first pair of AND-gates.

References Cited in the file of this patent

UNITED STATES PATENTS 2,644,887 Wolfe ------------------ July 7, 1953

2,806,947 MacKnight ------------ Sept. 17, 1957

2,816,223 Nelson ---------------- Dec. 10, 1957

FOREIGN PATENTS 866,109 Great Britain ---------- Dec. 23, 1959

OTHER REFERENCES

A "Scale of Two" High-Speed (W. B. Lewis) Counter Using Hand Vacuum Triodes.

Proceedings of the Cambridge Philosophical Society, vol. 33, pp. 549–558, 1937.